United States Patent
Vuoppola

(10) Patent No.: US 6,885,855 B1
(45) Date of Patent: Apr. 26, 2005

(54) HIGH FREQUENCY AMPLIFICATION CIRCUIT

(75) Inventor: Esa Vuoppola, Oulu (FI)

(73) Assignee: ADC Telecommunications, Inc., Eden Prairie, MN (US)

( * ) Notice: Subject to any disclaimer, the term of this patent is extended or adjusted under 35 U.S.C. 154(b) by 521 days.

(21) Appl. No.: 09/685,475

(22) Filed: Oct. 10, 2000

(51) Int. Cl.⁷ .................................................. H04B 1/10
(52) U.S. Cl. ..................................... 455/306; 455/303
(58) Field of Search .............................. 455/82, 83, 88, 455/306, 303, 127.3, 341, 143, 144, 550, 560, 561, 339, 311, 562.1, 84, 78, 552.1, 15, 126, 266; 330/151, 51, 286

(56) References Cited

U.S. PATENT DOCUMENTS

| | | | |
|---|---|---|---|
| 5,821,811 A | * 10/1998 | Persson ........................ | 330/51 |
| 5,890,056 A | * 3/1999 | Garner et al. ............... | 455/67.1 |
| 6,043,721 A | * 3/2000 | Nagode et al. ............. | 332/117 |
| 6,047,199 A | 4/2000 | DeMarco | |
| 6,195,561 B1 | * 2/2001 | Rose .......................... | 455/523 |
| 6,374,109 B1 | * 4/2002 | Shaheen et al. ............ | 455/434 |

FOREIGN PATENT DOCUMENTS

| | | |
|---|---|---|
| DE | 0 43 18 531 A | 1/1995 |
| EP | 0 476 908 A | 3/1992 |
| GB | 2 315 643 A | 2/1998 |

OTHER PUBLICATIONS

Weinhaus, C. et al., "Cellular to PCS: A Wireless Primer," *Telecommunications Industries Analysis Project*, Presentation at the Feb. 1996 NARUC Meeting, Washington, DC, pp. 1–43 (Dec. 21, 1995).

* cited by examiner

*Primary Examiner*—Nay Maung
*Assistant Examiner*—Tu X Nguyen
(74) *Attorney, Agent, or Firm*—Fogg & Associates LLC.; Scott V. Lundberg

(57) ABSTRACT

An amplification circuit for a wireless base station is provided. The amplification circuit includes a first port adapted to communicate signals to and from an antenna and a second port adapted to communicate signals to and from a base station. The amplification circuit further includes a first path and a second path with each path coupled between the first and second ports. The first path includes at least one bandpass filter and an amplifier that pass and amplify upstream signals in a first frequency band. The second path includes a filter that stops upstream signals in the first frequency band and passes upstream signals in at least a second frequency band and downstream signals in at least third and fourth frequency bands.

24 Claims, 4 Drawing Sheets

HIGH FREQUENCY AMPLIFICATION CIRCUIT

TECHNICAL FIELD

The present invention relates generally to the field of wireless communication and, in particular, to a high frequency amplification circuit.

BACKGROUND

Wireless telecommunications systems transmit signals between users using radio frequency (RF) signals. A typical wireless system includes a plurality of base stations that are connected to the public switched telephone network (PSTN) via a mobile switching center (MSC). Each base station includes a number of radio transceivers that are typically associated with a transmission tower. Each base station is located so as to cover a geographic region known colloquially as a "cell." Each base station communicates with wireless terminals, e.g. cellular telephones, pagers, and other wireless units, located in its geographic region or cell.

A base station includes a number of modules that process RF signals for communication with wireless terminals, e.g., cellular telephones, pagers. The modules of a typical base station include, by way of example, mixers, amplifiers, filters, transmission lines, antennas and other appropriate circuits. Each module of the base station is designed to allow the base station to communicate with wireless terminals in one of a number of possible frequency bands based on the service supported by the base station.

A variety of wireless services are offered throughout the world. For each service, a specific band or bands of the frequency spectrum is licensed for providing the service. For example, in the United States, cellular telephone service is typically available in the 824–849 Megahertz (MHz) and 869–894 MHz frequency bands and personal communication services (PCS) are offered in the 1850–1990 MHz frequency range. Conventionally, each service that is offered uses its own set of base stations. This is due in part to the fact that signals of the various services have different ranges due to differences in the frequencies of the signals being transmitted. Unfortunately, this does not allow a service provider to adequately leverage off existing infrastructure used for a first service when introducing a second service in a different frequency band in the same service area.

For the reasons stated above, and for other reasons stated below which will become apparent to those skilled in the art upon reading and understanding the present specification, there is a need in the art for improvements in implementing services in a single geographic area that use different portions of the frequency spectrum.

SUMMARY

The above mentioned problems with wireless networks and other problems are addressed by embodiments of the present invention and will be understood by reading and studying the following specification. Embodiments of the present invention provide an amplification circuit that selectively amplifies signals in a frequency band associated with a first service and passes, without amplification, signals in a second frequency band associated with a second service such that base stations can support both first and second services over a substantially co-extensive geographic region.

More particularly, in one embodiment an amplification circuit for a wireless base station is provided. The amplification circuit includes a first port adapted to communicate signals to and from an antenna and a second port adapted to communicate signals to and from a base station. The amplification circuit further includes a first path and a second path with each path coupled between the first and second ports. The first path includes at least one bandpass filter and an amplifier that pass and amplify upstream signals in a first frequency band. The second path includes a filter that stops upstream signals in the first frequency band and passes upstream signals in at least a second frequency band and downstream signals in at least third and fourth frequency bands.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
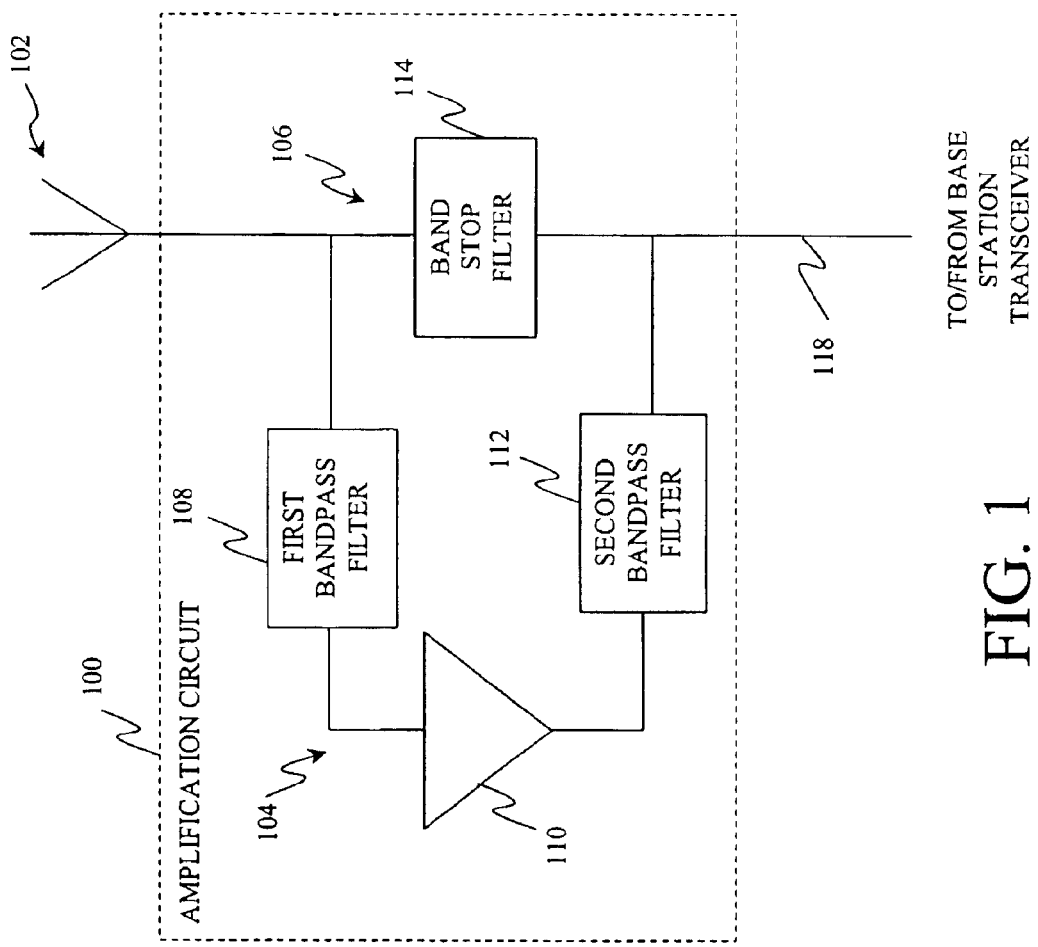
FIG. 1 is a block diagram of an embodiment of an arrangement for an antenna of a base station with an amplification circuit constructed according to the teachings of the present invention.

FIG. 1 is a block diagram of an embodiment of an arrangement for an antenna for a base station with an amplification circuit, indicated generally at 100, and constructed according to the teachings of the present invention. Amplification circuit 100 is adapted to be used as a tower top amplifier in a wireless base station in a system that supports services in at least two different frequency bands, e.g., any two of Advanced Mobile Phone Service (AMPS), Nordic Mobile Telephone (NMT) service, Total Access Communication System (TACS), digital cellular using Time Division Multiple Access (TDMA), e.g., Global System for Mobile Communications (GSM) or Code Division Multiple Access (CDMA), digital Personal Communications Service (PCS), or any other appropriate wireless communication service whether existing or later developed. For purposes of this specification, the term "upstream" means communications from wireless terminals to a base station and the term "downstream" means communications from base stations to wireless terminals.

Amplification circuit 100 amplifies only a portion of the upstream frequency spectrum received at the base station, e.g., the upstream frequency band of one of the supported services. Through this selective amplification, amplification circuit 100 improves the signal-to-noise ratio at the receiver portion of the base station transceiver of the service using a higher frequency band so that the base station can support the service over a larger geographic area. When sufficient amplification is provided, each base station provides coverage for both services over a co-extensive geographic region. Thus, amplification circuit 100 allows a service provider to use the same base stations for supporting two or more different services that use different frequency bands even though transmissions from wireless terminals at different frequencies for the services may have different strengths when received at the base stations.

Amplification circuit 100 processes signals received at antenna 102. Amplification circuit 100 includes first and second paths 104 and 106, respectively. First path 104 selectively amplifies signals in an upstream frequency band associated with a first service. In one embodiment, first path 104 selectively amplifies signals for a personal communication service (PCS) operating in the frequency range of approximately 1850 to 1990 MHz. In other embodiments, first path 104 amplifies signals in a frequency band associated with other selected services whether currently existing or later created. Second path 106 selectively passes signals in an upstream frequency band associated with at least one additional service. Second path 106 also passes downstream signals for the first and the at least one additional service. In one embodiment, this additional service comprises a conventional cellular service such as analog AMPS in a frequency range between 800 and 900 MHz.

First path 104 is coupled to receive upstream signals from antenna 102. First path 104 includes first bandpass filter 108, amplifier 10, and second bandpass filter 112. First and second bandpass filters 108 and 112 each include a pass band that is designed to pass signals in a portion of the frequency spectrum associated with the first service. First bandpass filter 108, amplifier 110, and second bandpass filter 112 are coupled in series between a first port associated with antenna 102 (the "antenna port") and a second port of amplification circuit 100 that communicates with a base station transceiver (the "base station port").

Second path 106 includes band stop filter 114. The band stop filter 114 is designed to prevent the passage of upstream signals in a frequency band associated with the first service. Therefore, band stop filter 114 is also designed to pass signals in the upstream frequency band if the at least one additional service and to pass signals in the downstream frequency bands of the first and the at least one additional service.

In operation, amplification circuit 100 receives and selectively amplifies upstream signals at a base station in a wireless network and receives and passes downstream signals. In one embodiment, the upstream signals received by amplification circuit 100 comprise signals from wireless terminals associated with first and second services. The upstream signals from the first, higher frequency, service are passed and amplified in first path 104 while signals for the second, lower frequency, service are passed by path 106. Further, downstream signals generated at the base station for both services are passed by second path 106.

In first path 104, first bandpass filter 108 passes upstream signals in the upstream, frequency band associated with the first service. The signals are amplified in amplifier 10. Further, the amplified signals are passed to and filtered by second bandpass filter 112.

In second path 106, band stop filter 114 passes signals in both upstream and downstream directions in frequencies outside of the upstream frequency band associated with the first service. Therefore, band stop filter 114 passes, without amplification, signals in the upstream frequency band associated with the at least one additional service and the downstream frequency bands of the first and the at least one additional service.

It is noted that the term "band stop filter" as used in this specification means a filter that selectively stops a selected frequency band for one service and allows upstream and downstream frequency bands for other services to be passed. Thus, it is not necessary that the band stop filter have a pass band down to DC. In fact, the effective bandwidth of the band stop filter may be limited in some embodiments by DC grounding of the antenna port for protection from lightning. In most cases, it is sufficient if the band stop filter has passes signals within the range from 500 to 2500 MHz with the exception of the selected upstream frequency band, e.g., 1850–1910 MHz.

Figure 2:
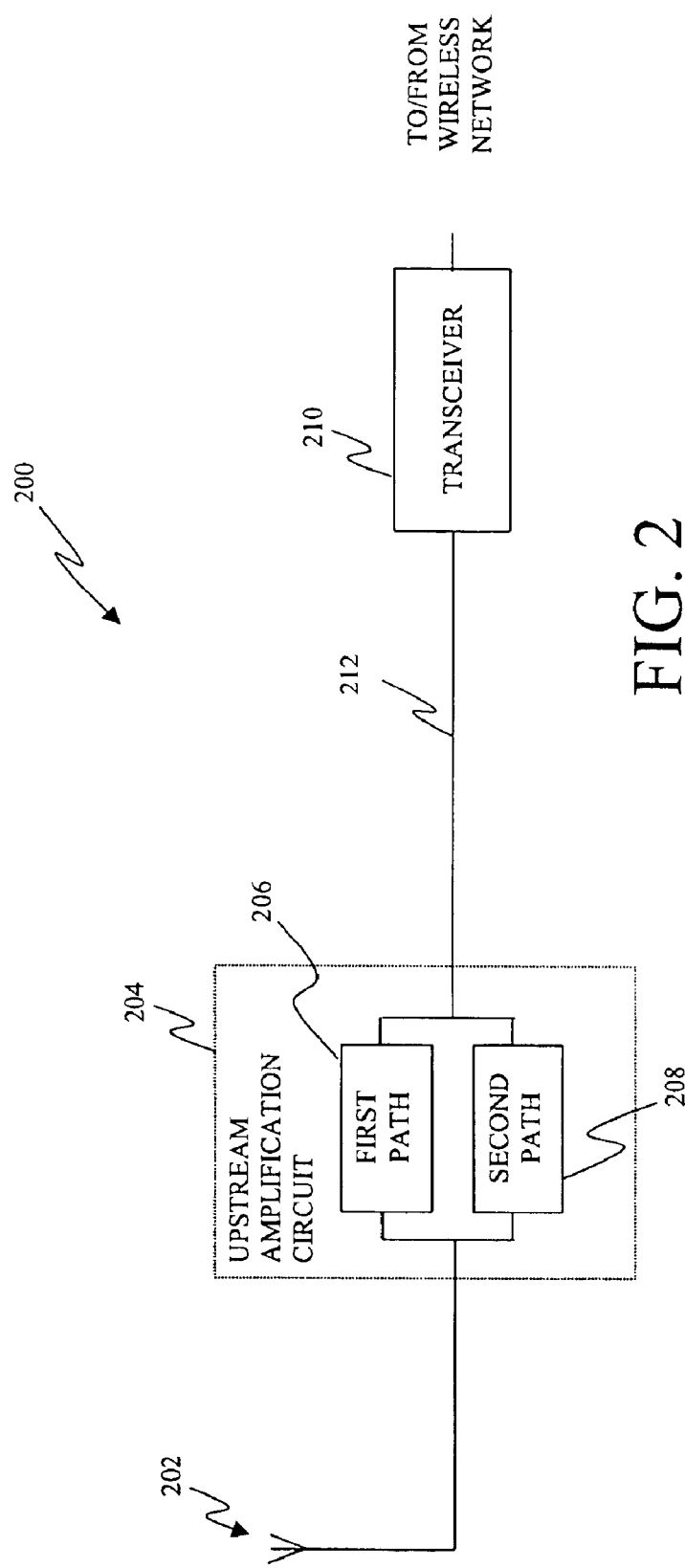
FIG. 2 is a block diagram of an embodiment of a base station including an amplification circuit according to the teachings of the present invention.

FIG. 2 is a block diagram of an embodiment of a base station, indicated generally at 200, including an amplification circuit 204 according to the teachings of the present invention. Base station 200 advantageously supports multiple services using different frequency bands over co-extensive geographic ranges through the inclusion of amplification circuit 204.

Amplification circuit 204 includes first and second paths 206 and 208. First and second paths 206 and 208 are each coupled to antenna 202. Further, first and second paths 206 and 208 are each coupled to transceiver 210 over common feeder cable 212. It is noted that feeder cable 212 is also coupled to carry downstream signals to antenna 202 from transceiver 210. Transceiver 210 provides an output for base station 200. It is understood that transceiver 210 includes any appropriate receiver and transmitter for processing signals according to selected wireless standards whether currently existing or later developed. In one embodiment, first path 206 includes an amplifier that amplifies signals in a frequency band for a first service and second path 204 passes upstream signals, without amplification, in at least a second frequency band for a second service. Further, second path 204 passes, without amplification, downstream signals for both the first and second services. In one embodiment, amplification circuit 204 is constructed according to the teachings of amplification circuit 100 FIG. 1.

Figure 3:
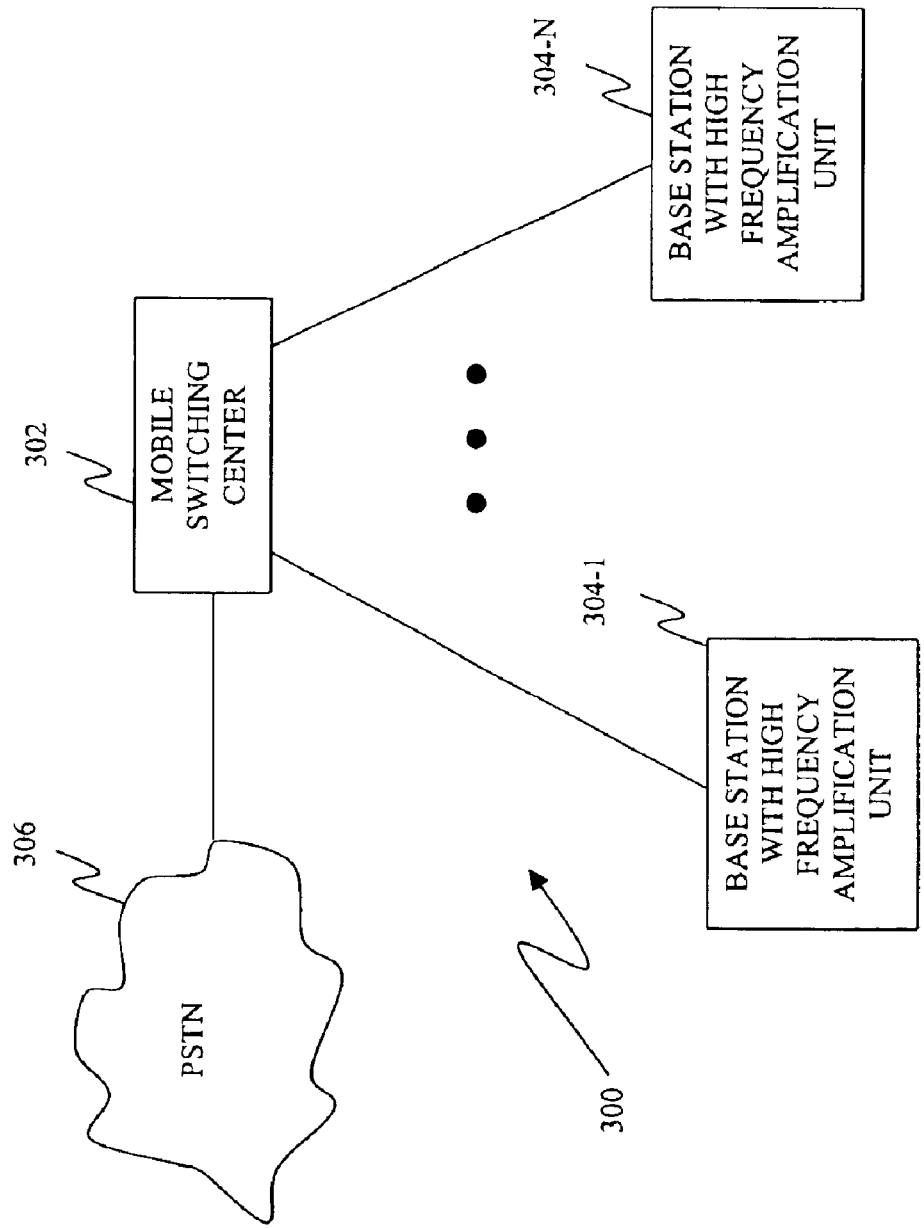
FIG. 3 is a block diagram of a wireless system including base stations with high frequency amplification circuits according to the teachings of the present invention.

FIG. 3 is a block diagram of a wireless system, indicated generally at 300, including base stations 304-1, . . . , 304-N with high frequency amplification circuits according to the teachings of the present invention. Wireless system 300 includes mobile switching center 302 that connects base stations 304-1, . . . , 304-N with the public switched telephone network (PSTN) 306. Wireless system 300 advantageously supports at least two services with different frequency bands using a common set of base stations 304-1, . . . , 304-N that each service the same geographic area for both services. Base stations 304-1, . . . , 304-N each including a high frequency amplification circuit, such as amplification circuit 100 of FIG. 1. This amplification circuit selectively amplifies upstream signals in a first frequency band associated with a first service, e.g., a frequency band associated with personal communications services (PCS), and selectively passes upstream signals in a second frequency band associated with a second service, e.g., analog cellular service, and downstream signals for both services. It is understood that wireless system 300, in other embodiments, supports any appropriate combination of services with a common set of base stations 304-, . . . , 304-N for the services.

Figure 4:
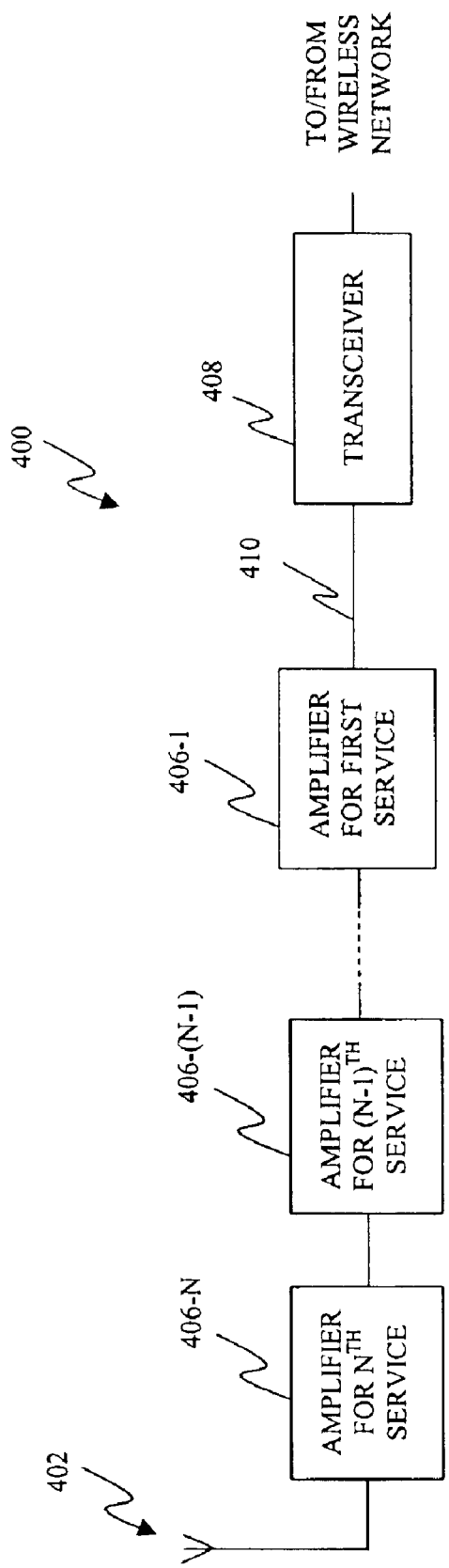
FIG. 4 is a block diagram of another embodiment of a base station including a plurality of cascaded amplification circuits according to the teachings of the present invention.

FIG. 4 is a block diagram of another embodiment of a base station, indicated generally at 400, including a plurality of cascaded amplifiers 406-1, . . . , 406-N, according to the teachings of the present invention. In this embodiment, base station 400 supports up to (N+1) services by providing cascaded amplifiers 406-1, . . . , 406-N. Each amplifier 406-1, . . . , 406-N selectively amplifies an upstream frequency band for a selected service, passes upstream frequency bands for the other services and passes downstream frequency bands for each of the services.

Transceiver 408 receives and transmits signals for base station 400. It is understood that transceiver 408 includes any appropriate receiver and transmitter for processing signals according to selected wireless standards whether currently existing or later developed. In one embodiment, amplifiers 406-1, . . . , 406-N are constructed according to the teachings of amplification circuit 100 FIG. 1.

In one embodiment, amplifiers 406-1, . . . , 406-N are coupled to allow DC power received at amplifier 406-1 to be passed through the chain of amplifiers to amplifier 406-(N−1). DC power is supplied over feeder cable 410 from transceiver 408. Amplifiers 406-1, . . . , 406-(N−1) are each powered by this DC power from transceiver 408 and pass the power up the chain to amplifier 406-(N−1).

Amplifier 406-N is powered in a more conventional manner. Specifically, the antenna port of amplifier 406-N is coupled grounded for protection from lightning strikes. Amplifier 406-N further includes a bias-T circuit that removes DC power from the connection with amplifier 406-(N−1). This feature takes advantage of the fact that bandstop filters used in amplifiers 406-1, . . . , 406-(N−1) are not inherently DC grounded and thus can pass DC power if neither of the ampifier's ports are grounded.

CONCLUSION

Although specific embodiments have been illustrated and described in this specification, it will be appreciated by those of ordinary skill in the art that any arrangement that is calculated to achieve the same purpose may be substituted for the specific embodiment shown. This application is intended to cover any adaptations or variations of the present invention. For example, the application is not limited to the services identified herein. Amplification circuit 100, in other embodiments, operates on signals for any two services with one service operating at a higher frequency.

What is claimed is:

1. An amplification circuit for a wireless base station, the amplification circuit comprising:
   a first port adapted to communicate signals to and from an antenna;
   a second port adapted to communicate signals to and from a base station;
   a first path, coupled between the first and second ports, the first path including at least one bandpass filter and an amplifier that pass and amplify upstream signals in a first frequency band; and
   a second path, coupled between the first and second ports, the second path including a filter that stops upstream signals in the first frequency band and passes upstream signals in at least a second frequency band and downstream signals in at least third and fourth frequency bands.

2. The circuit of claim 1, wherein the first path includes:
   a first bandpass filter, having an input that receives upstream signals from the first port, the first bandpass filter passing signals in the first frequency band;
   an amplifier, coupled to the first bandpass filter, that amplifies the passed signals in the first frequency band; and
   a second bandpass filter, coupled to the amplifier, that passes signals in the first frequency band to the second port.

3. The circuit of claim 2, wherein the first bandpass filter passes signals between 1850 and 1990 Megahertz.

4. The circuit of claim 2, wherein the first bandpass filter passes signals with frequencies assigned to personal communications services (PCS).

5. The circuit of claim 2, wherein the second path includes a bandstop filter that stops signals with frequencies assigned to personal communications services (PCS).

6. The circuit of claim 1, wherein the first frequency band is higher than the second frequency band.

7. A base station circuit for a wireless system that supports services in at least first and second frequency bands, the circuit including:
   an antenna;
   at least one amplification circuit, the amplification circuit including:
   a first path, coupled to the antenna, the first path including at least one bandpass filter and an amplifier that pass and amplify upstream signals in the first frequency band,
   a second path, coupled in parallel with the first path, the second path including a filter that stops upstream signals in the first frequency band and passes upstream signals in at least the second frequency band along with downstream signals; and
   a transceiver, coupled to the first and second paths of the amplification circuit, that is adapted to receive upstream signals in at least the first and second frequency bands and to transmit the downstream signals in at least third and fourth frequency bands.

8. The circuit of claim 7, wherein the first path includes:
   a first bandpass filter, having an input that receives upstream signals from the antenna, the first bandpass filter passing signals in the first frequency band;
   an amplifier, coupled to the first bandpass filter, that amplifies the passed signals in the first frequency band; and
   a second bandpass filter, coupled to the amplifier, that passes signals in the first frequency band.

9. The circuit of claim 8, wherein the first bandpass filter passes signals between 1850 and 1990 Megahertz.

10. The circuit of claim 8, wherein the first bandpass filter passes signals with frequencies assigned to personal communications services (PCS).

11. The circuit of claim 8, wherein the second path includes a bandstop filter that stops signals with frequencies assigned to personal communications services (PCS).

12. The circuit of claim 7, wherein the transceiver is coupled to the amplification circuit through a single feeder cable for upstream and downstream signals.

13. The circuit of claim 7, wherein the transceiver communicates upstream and downstream signals with the antenna through a single feeder cable.

14. The circuit of claim 7, wherein the amplification circuit comprises a plurality of amplification circuits that are cascaded to allow upstream frequency bands associated with separate services to be selectively amplified.

15. An amplification circuit for a wireless base station, the amplification circuit comprising:
   a first port adapted to communicate signals to and from an antenna, the signals including upstream signals in at least first and second frequency bands each associated with a different service, wherein the first frequency band is higher in frequency than the second frequency band;

a second port adapted to communicate signals to and from a base station;

a first path including:
a first bandpass filter, coupled to the first port, the first bandpass filter passing upstream signals in the first frequency band and stopping upstream signals in the second frequency band,
an amplifier, coupled to the first bandpass filter, the amplifier amplifying signals in the first frequency band, and
a second bandpass filter, coupled to the amplifier, the second bandpass filter passing upstream signals in the first frequency band to the second port;

a second path, coupled between the first and second ports, the second path including a band stop filter that stops signals in the first frequency band and passes at least upstream signals in the second frequency band and passes downstream signals received at the second port.

16. The circuit of claim 15, wherein the first frequency band comprises a band above 1800 Megahertz and the second frequency band comprises a band below 1000 Megahertz.

17. The circuit of claim 15, wherein the pass band of the first and second bandpass filters overlaps in frequency with a stop band of the band stop filter.

18. A wireless system, comprising:
a mobile switching center that is adapted to be coupled to the public switched telephone network;
a plurality of base stations, communicatively coupled to the mobile switching center, that are adapted to communicate with wireless terminals using one of at least two services;
wherein each base station supports the at least two services within the geographic area of the base station; and
further wherein each base station includes an amplification circuit that amplifies signals received from wireless terminals for one of the services and that passes without amplification signals from other wireless terminals for the other service and passes downstream signals to the wireless terminals.

19. The wireless system of claim 18, wherein each base station is adapted to communicate upstream signals for the wireless terminals in a first frequency band for a first of the at least two services and in a second frequency band for a second of the at least two services.

20. The wireless system of claim 19, wherein the first frequency band is above 1800 Megahertz and the second frequency band is below 1000 Megahertz.

21. A base station, comprising:
an antenna;
a plurality of amplification circuits coupled to the antenna and coupled in series, each amplification circuit adapted to selectively amplify upstream signals in a selected frequency band for a selected service and to pass downstream signals and other upstream signals;
a feeder cable, coupled to a first one of the serially connected plurality of upstream amplification circuits; and
at least one transceiver, coupled to the feeder cable, that is adapted to communicate signals over the antenna for a plurality of services.

22. The base station of claim 21, wherein the first of the plurality of upstream amplification circuits receives a DC voltage over the feeder cable and passes the DC voltage to at least another of the plurality of upstream amplification circuits.

23. The base station of claim 21, wherein each of the plurality of amplification circuits includes first and second paths with the first path selectively amplifying a selected upstream frequency band and the second path passing upstream and downstream signals outside the selected frequency band.

24. The base station of claim 21, wherein a last of the plurality of amplification circuits includes a DC grounded antenna port.

* * * * *